US011415160B2

United States Patent
Sin Yan Too et al.

(10) Patent No.: US 11,415,160 B2
(45) Date of Patent: Aug. 16, 2022

(54) LOCKING PUSH PIN AND HEATSINK ASSEMBLY

(71) Applicant: Radian Thermal Products, Inc., Santa Clara, CA (US)

(72) Inventors: Thierry Sin Yan Too, San Ramon, CA (US); Andrew Richard Masto, San Jose, CA (US)

(73) Assignee: RADIAN THERMAL PRODUCTS, INC., Santa Clara, CA (US)

( * ) Notice: Subject to any disclaimer, the term of this patent is extended or adjusted under 35 U.S.C. 154(b) by 252 days.

(21) Appl. No.: 16/528,333

(22) Filed: Jul. 31, 2019

(65) Prior Publication Data

US 2021/0033132 A1 Feb. 4, 2021

(51) Int. Cl.
*F16B 21/12* (2006.01)
*F28F 9/26* (2006.01)
*F16B 21/08* (2006.01)
*F16B 21/06* (2006.01)
*H01L 23/40* (2006.01)

(52) U.S. Cl.
CPC ............ *F16B 21/12* (2013.01); *F16B 21/065* (2013.01); *F16B 21/086* (2013.01); *F28F 9/26* (2013.01); *H01L 23/4093* (2013.01)

(58) Field of Classification Search
CPC .... F16B 19/1081; F16B 21/12; F16B 21/065; H01L 23/4093
USPC ...................................... 411/45–48
See application file for complete search history.

(56) References Cited

U.S. PATENT DOCUMENTS

| | | | | |
|---|---|---|---|---|
| 4,694,544 A | * | 9/1987 | Chapman | F16B 21/065 24/625 |
| 4,927,287 A | * | 5/1990 | Ohkawa | F16B 21/086 24/297 |
| 5,775,860 A | * | 7/1998 | Meyer | F16B 19/1081 411/41 |
| 6,517,300 B2 | * | 2/2003 | Bentrim | F16B 5/04 411/45 |
| 6,769,849 B2 | * | 8/2004 | Yoneoka | F16B 5/0642 411/41 |
| 7,405,939 B2 | * | 7/2008 | Yang | H01L 23/4093 257/719 |
| 7,755,240 B2 | * | 7/2010 | Yang | F04D 29/646 310/91 |
| 8,695,177 B2 | * | 4/2014 | Kato | F16B 21/065 24/297 |

(Continued)

*Primary Examiner* — Flemming Saether
(74) *Attorney, Agent, or Firm* — Womble Bond Dickinson (US) LLP

(57) ABSTRACT

A locking push pin and methods of using the locking push pin to assemble a heatsink assembly, are described. The locking push pin includes a body lumen extending through a pin body, and several prongs radially outward from the body lumen. Peripheral surfaces of the prongs are separated by a body slot radially outward from the body lumen. The locking push pin includes a pin lock having a branch that extends through the body lumen and into the body slot between the peripheral surfaces. The pin lock advances from an unlocked configuration in which the branch is in the body slot proximal to a distal end of the prongs, allowing the prongs to deflect radially inward, to a locked configuration in which the branch is in the body slot at the distal end of the prongs, blocking deflection of the prongs. Other embodiments are also described and claimed.

18 Claims, 7 Drawing Sheets

(56) References Cited

U.S. PATENT DOCUMENTS 9,423,191 B2     8/2016   Whitney et al.
9,500,215 B2 * 11/2016   Kim .......................... F16B 2/26

* cited by examiner

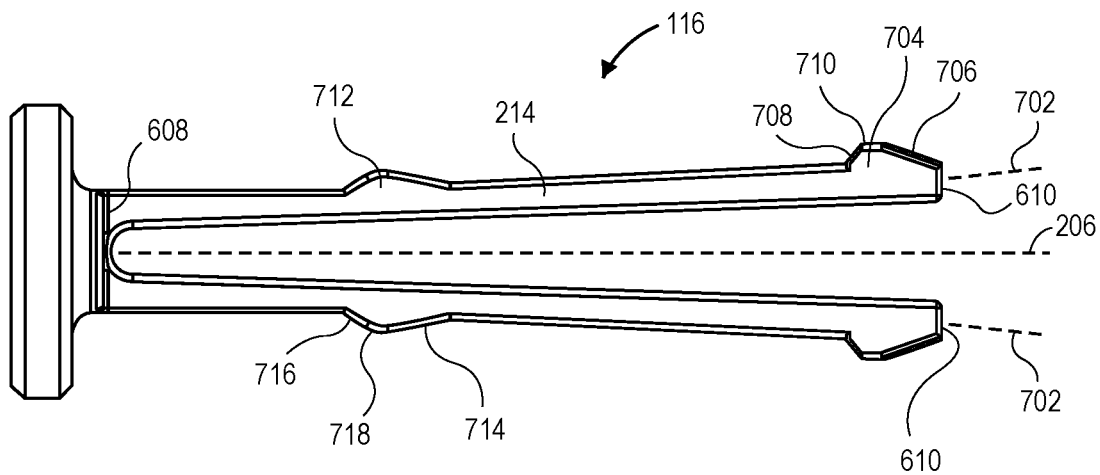

FIG. 7

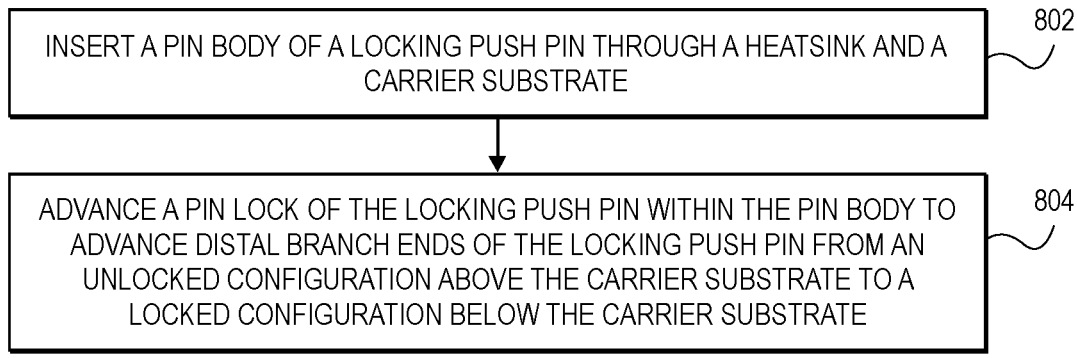

```
┌─────────────────────────────────────────────────────────────┐
│ INSERT A PIN BODY OF A LOCKING PUSH PIN THROUGH A HEATSINK AND A │ ─802
│                    CARRIER SUBSTRATE                         │
└─────────────────────────────────────────────────────────────┘
                              │
                              ▼
┌─────────────────────────────────────────────────────────────┐
│ ADVANCE A PIN LOCK OF THE LOCKING PUSH PIN WITHIN THE PIN BODY TO │ ─804
│ ADVANCE DISTAL BRANCH ENDS OF THE LOCKING PUSH PIN FROM AN   │
│  UNLOCKED CONFIGURATION ABOVE THE CARRIER SUBSTRATE TO A     │
│    LOCKED CONFIGURATION BELOW THE CARRIER SUBSTRATE          │
└─────────────────────────────────────────────────────────────┘
```

FIG. 8

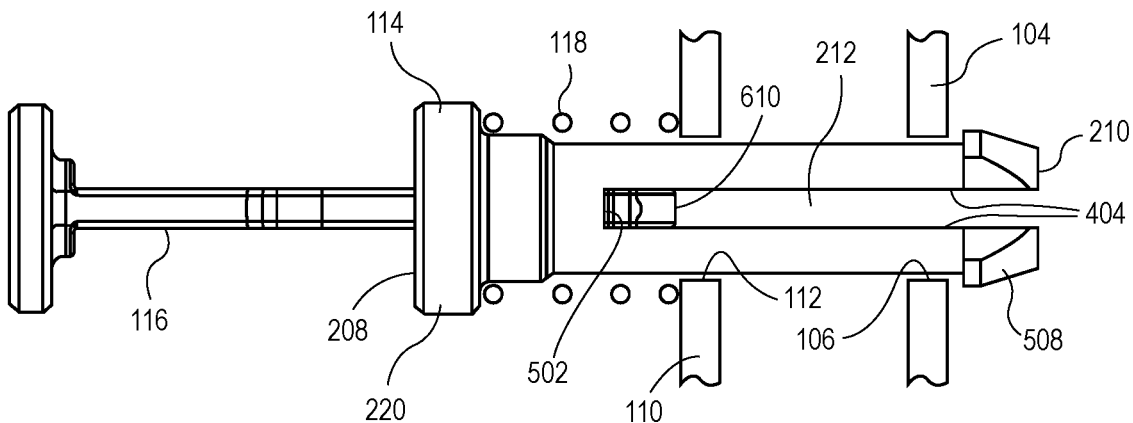

FIG. 9

LOCKING PUSH PIN AND HEATSINK ASSEMBLY

BACKGROUND

Field

The present disclosure relates to push pins for fastening components. More specifically, the present disclosure relates to multi-part push pins for coupling a heatsink to a heat source.

Background Information

Printed circuit boards (PCBs) support and electrically connect electronic components of various types mounted on a top side and in some cases a bottom side of the PCB. For example, passive electronic components such as resistors, inductors, or capacitors can be mounted on a PCB. Similarly, active electronic components such as integrated circuits can be mounted on the PCB. The electronic components generate heat during use, and the heat can be conducted and radiated away from the electronic components using a heatsink. For example, the heatsink can be mounted on an electronic component to transfer heat generated by the component into a surrounding environment. The heatsink may be retained against the electronic component by retention hardware, which maintains contact between the heat source and the heatsink.

Retention hardware includes fasteners of the type referred to as push pins. Push pins are designed to retain a component, such as a heatsink, in contact with another component, such as an electronic component on a PCB. Typically, push pins include unitary bodies having barbed distal ends that insert into a hole in the PCB. The barbed distal end resists back out from the hole after insertion. The push pins include a proximal end, which typically has a head to allow a user to press the push pin through the PCB and to retain a compression spring. The compression spring can press against the heatsink to hold the heatsink against the electronic component.

SUMMARY

Existing push pins may include slots in the barbed distal ends that allow the barbs to collapse and pass through the hole in a printed circuit board (PCB). When the barbs pass entirely through the PCB hole, the barbed end expands such that the barb engages the PCB and resists pulling out of the hole easily. Under certain conditions, however, the slotted end may allow the barbed ends to collapse unintentionally, allowing the push pin to back out from the PCB. For example, when the push pin is jolted by shock or vibration, or when an oversized compression spring is used, the barbed end can back out of the PCB hole, causing a loss of contact between the heatsink and the electronic component.

A locking push pin and methods of using the locking push pin to assemble a heatsink assembly, are described. The locking push pin includes a lock component that fills a slot in a main push pin body to reduce a likelihood that a barbed end of the main push pin body will collapse and back out of the PCB. In an embodiment, the locking push pin includes a pin body having a body lumen extending along a central axis from a proximal body end to a distal body end. One or more prongs of the locking push pin can be disposed radially outward from the body lumen. For example, the prongs can extend longitudinally from a spring flange of the locking push pin to the distal body end outward from the body lumen. A body slot can extend radially outward from the body lumen between peripheral surfaces of the one or more prongs. For example, the body slot can extend from the distal body end to a proximal slot end. The body slot provides clearance between the prongs to allow the prongs to deflect radially inward.

In an embodiment, the locking push pin further includes a pin lock that mates to the pin body. The pin lock can include a branch extending in the body lumen to a distal branch end. The distal branch end may be disposed with the body slot between the peripheral surfaces of the prongs. For example, the distal branch end can slide within the body slot between the proximal slot end and the distal body end. When the branch is between the prongs, it resists radially inward movement of the prongs, effectively locking them in place.

The prongs and the branch can have relative geometries that allow the branch to be more flexible than the prongs. For example, the branch can be longer than the prongs. Furthermore, the prongs can be formed from brass and the branch can be formed from a flexible polymer. Accordingly, rather than forcing the prongs outward to lock the pin body into a hole of a PCB, the branch can wedge in one or more body slots of the main body lumen to prevent collapse of the pin body prongs and thereby lock the pin body within a hole of a PCB.

In an embodiment, a heatsink assembly and a method of assembling the heatsink assembly includes a heat source mounted on a carrier substrate having a substrate hole. Furthermore, a heatsink can be mounted on the heat source, and can have a heatsink hole. The pin body of the locking push pin can be inserted through the holds of the heatsink and the carrier substrate such that the locking push pin extends from the proximal body end of the pin body above the heatsink to a distal body end of the pin body below the carrier substrate. The prongs of the pin body can include retention features, e.g., barbs, that engage an underside of the carrier substrate when the pin body is inserted.

The pin lock can be disposed within the body in an unlocked configuration. For example, in the unlocked configuration, the distal branch end can be within the body slot above the carrier substrate. Accordingly, a gap can separate the prongs at the distal body end, allowing the prongs to deflect radially inward for insertion or removal within the carrier substrate hole.

The pin lock can be advanced within the pin body to transition the locking push pin to a locked configuration. As the pin lock advances, the distal branch end can slide forward within the body slots to the distal body end. When the distal branch end is at the distal body end, below the carrier substrate, the locking push pin locks into the carrier substrate. In the locked configuration, the branch can fill at least a portion of the body slot between and/or proximal to the retention feature of the prongs. Accordingly, collapse of the prongs and the retention features can be prevented, and the retention features can remain engaged with the underside of the carrier substrate. When the pin body is locked in place by the pin lock, a compression spring held between a head of the pin body and the heatsink can force the heatsink downward into contact with an electronic component mounted on the carrier substrate. The locking push pin can therefore securely hold the heatsink assembly together despite shock or vibrational loads.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

FIG. 7 is a side view of a pin lock of a locking push pin, in accordance with an embodiment.

FIG. 8 is a flowchart of a method of assembling a heatsink assembly using a locking push pin, in accordance with an embodiment.

FIGS. 9-13 are views of a push pin at various stages of a method of assembling a heatsink assembly using a locking push pin, in accordance with an embodiment.

DETAILED DESCRIPTION

Figure 1:
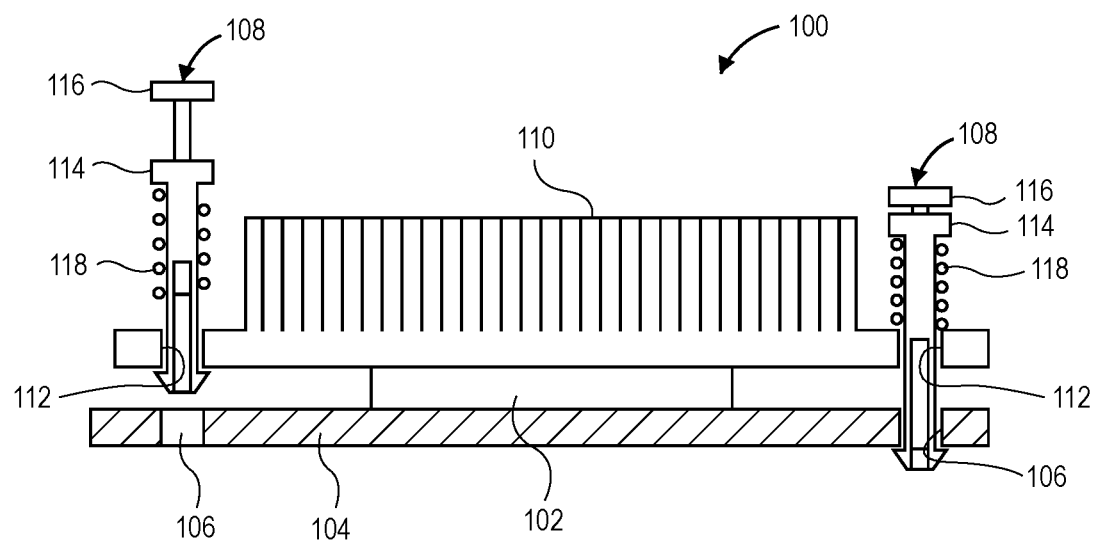
FIG. 1 is a cross-sectional view of a heatsink retained against a heat source in a heatsink assembly having locking push pins, in accordance with an embodiment.

Embodiments describe a locking push pin for securing a heatsink to a carrier substrate of a heatsink assembly. The locking push pin may be used to retain a heatsink against an integrated circuit mounted on a printed circuit board (PCB). The locking push pin may also be used in other applications, such as to retain a heatsink against another heat source on or off of a PCB, and thus, reference to the locking push pin as being used to retain a heatsink against an integrated circuit on a PCB is not limiting.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the embodiments. In other instances, well-known processes and manufacturing techniques have not been described in particular detail in order to not unnecessarily obscure the description. Reference throughout this specification to "one embodiment," "an embodiment," or the like, means that a particular feature, structure, configuration, or characteristic described is included in at least one embodiment. Thus, the appearance of the phrase "one embodiment," "an embodiment," or the like, in various places throughout this specification are not necessarily referring to the same embodiment. Furthermore, the particular features, structures, configurations, or characteristics may be combined in any suitable manner in one or more embodiments.

The use of relative terms throughout the description may denote a relative position or direction. For example, "distal" may indicate a first direction along a longitudinal axis of an anchor. Similarly, "proximal" may indicate a second direction opposite to the first direction. Such terms are provided to establish relative frames of reference, however, and are not intended to limit the use or orientation of a heatsink retainer to a specific configuration described in the various embodiments below.

In an aspect, a locking push pin for securing a heatsink to a heat source, e.g., an electronic component on a PCB, is provided. The push pin includes a lock component, e.g., a pin lock, to lock a main body of the locking push pin, e.g., a pin body, after the main body has been inserted into holes of the heatsink and the PCB. More particularly, a distal end of the main body can be passed through a substrate hole in a carrier substrate of the PCB to engage a bottom of the carrier substrate. The distal end can include a slot in the main body that allows the distal end to collapse radially inward and pass through the hole. When the distal end of the main body has engaged the carrier substrate, the lock component can be slid or wedged within the slot at the distal end of the pin body. The lock component can prevent the collapse of the distal end, and thus, reduce a likelihood of removal of the distal end from the substrate hole. In summary, the locking push pin addresses the above-noted shortcomings of existing retention hardware by mitigating the effects of certain conditions, e.g., vibration, on the heatsink fastener.

Referring to FIG. 1, a cross-sectional view of a heatsink retained against a heat source in a heatsink assembly having locking push pins is shown in accordance with an embodiment. A heatsink assembly 100 includes a heat source 102. The heat source 102 can be an electronic component mounted on a carrier substrate 104 of a PCB. For example, the heat source 102 can be an active electronic component such as an integrated circuit. Alternatively, the heat source 102 can be any type of device dissipating power during its operation, including light sources, electrical solenoids, electric motors, and passive electronic components, as well as other devices commonly known or yet to be conceived. The carrier substrate 104 has one or more substrate holes 106, which may extend through a thickness of the carrier substrate 104. The substrate holes 106 may be sized and located to receive fastening hardware, such as one or more locking push pins 108.

The locking push pins 108 can hold a heatsink 110, or another heat exchange device, against the heat source 102. More particularly, the heatsink 110 can be mounted on the heat source 102, e.g., in direct contact with the heat source 102. The heatsink 110 may be thermally coupled to the heat source 102 by a thermal interface material disposed between the heat source 102 and the heatsink 110. The heatsink 110 can include one or more heatsink holes 112 sized and located to receive fastening hardware, such as the locking push pins 108.

In an embodiment, the locking push pin 108 is inserted through one or more of the heatsink 110, e.g., through the heatsink hole 112, or the carrier substrate 104, e.g., the substrate hole 106. For example, the leftmost locking push pin 108 in FIG. 1 is inserted through the heatsink hole 112, and the rightmost locking push pin 108 in FIG. 1 is inserted through both the heatsink hole 112 and the substrate hole 106. The leftmost locking push pin 108 is in an unlocked configuration. This is evident from a separation between a pin body 114 and a pin lock 116, as described further below. By contrast, the rightmost locking push pin 108 is in a locked configuration. This is evident from a reduced or no separation between the pin body 114 and the pin lock 116, as described further below.

The heatsink assembly 100 can include a compression spring 118 mounted on the pin body 114. When the locking push pin 108 is inserted through the heatsink 110 and the carrier substrate 104, the compression spring 118 can be sandwiched between the pin body 114 and an upper surface of the heatsink 110. Accordingly, the compression spring 118 can press on the heatsink 110 to hold the heatsink 110 against the heat source 102. The compression spring 118 can generate an axial load within the pin body 114 between an upper portion of the pin body 114 above the carrier substrate 104 and a lower portion of the pin body 114 below the carrier substrate 104. More particularly, the biasing force of the compression spring 118 can pull the lower portion of the pin body 114 against the carrier substrate 104. Accordingly, the locking push pin 108 and compression spring 118 can securely fasten the heatsink 110 to the carrier substrate 104 and the heat source 102 to facilitate heat transfer between those components.

Figure 2:
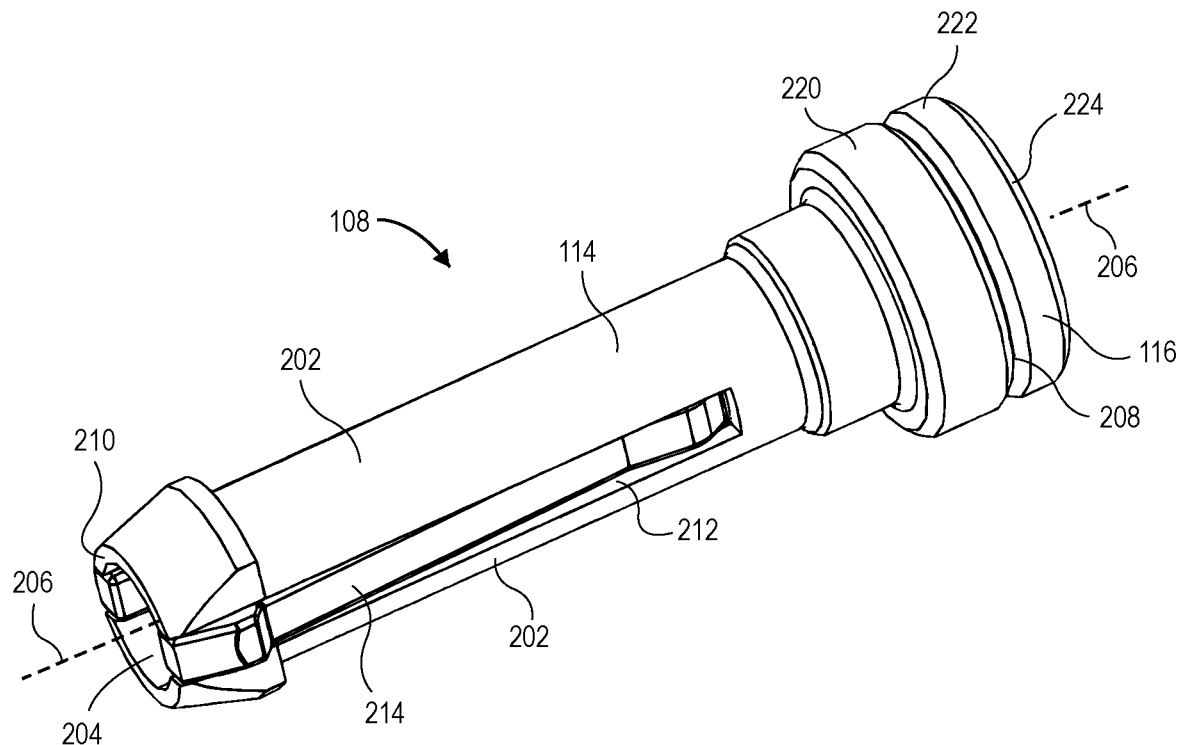
FIG. 2 is a perspective view of a locking push pin, in accordance with an embodiment.

Referring to FIG. 2, a perspective view of a locking push pin, in accordance with an embodiment. The locking push pin 108 can be a multi-part push pin that includes the pin lock 116 assembled to the pin body 114. Each of the locking push pin parts can have respective portions and features that interact to facilitate the assembly. For example, the pin body 114 can include one or more prongs 202 radially outward from a body lumen 204 that extends along the central axis 206 from a proximal body end 208 to a distal body end 210. The one or more prongs 202 can extend longitudinally to the distal body end 210, as shown. A body slot 212 can extend radially outward from the body lumen 204, and as described below, the body slot 212 may be sized and configured to receive a portion of the pin lock 116. More particularly, a branch 214 of the pin lock 116 may be disposed within the body slot 212 outside of the body lumen 204. Accordingly, the branch 214 of the pin lock 116 can interact with the body slot 212 of the pin body 114 to modulate a displacement of the distal body end 210. More particularly, when the branch 214 is at the distal body end 210, the branch 214 can prevent collapse of the prongs 202 in a radially inward direction at the distal body end 210. By contrast, when the branch 214 is proximal to the distal body end 210, the prongs 202 can collapse radially inward at the distal body end 210.

Other features of the pin body 114 and the pin lock 116, such as respective head portions, can interact during use of the locking push pin 108. For example, the pin body 114 may have a body head portion 220, such as a diametrically enlarged portion of the pin body 114, at the proximal body end 208. Similarly, the pin lock 116 can have a lock head portion 222, such as a diametrically enlarged portion of the pin lock 116, at a proximal lock end 224. The head portions can be pressed together, as shown in FIG. 2 and in the rightmost locking push pin of FIG. 1, to place the locking push pin 108 in a locked configuration. By contrast, the head portions can be separated, as shown in the leftmost locking push pin of FIG. 1, to place the locking push pin 108 in an unlocked configuration. In the unlocked configuration, the prongs 202 at the distal body end 210 are free to deflect radially inward to reduce an overall dimension of the distal body end 210 and to allow the distal body end 210 to pass through the heatsink hole 112 or the substrate hole 106. By contrast, in the locked configuration, inward movement of the prongs 202 at the distal body end 210 is blocked by the branch 214 in the body slot 212, and thus, back out of the prongs 202 from the substrate hole 106 or the heatsink hole 112 is resisted. Additional description of a structure and function of the locking push pin 108 is provided below, however, at this stage it should be apparent that the push pin parts interact to lock the push pin in place by resisting movement of the prongs 202 in a radially inward direction, rather than by forcing the prongs 202 in a radially outward direction.

Figure 3:
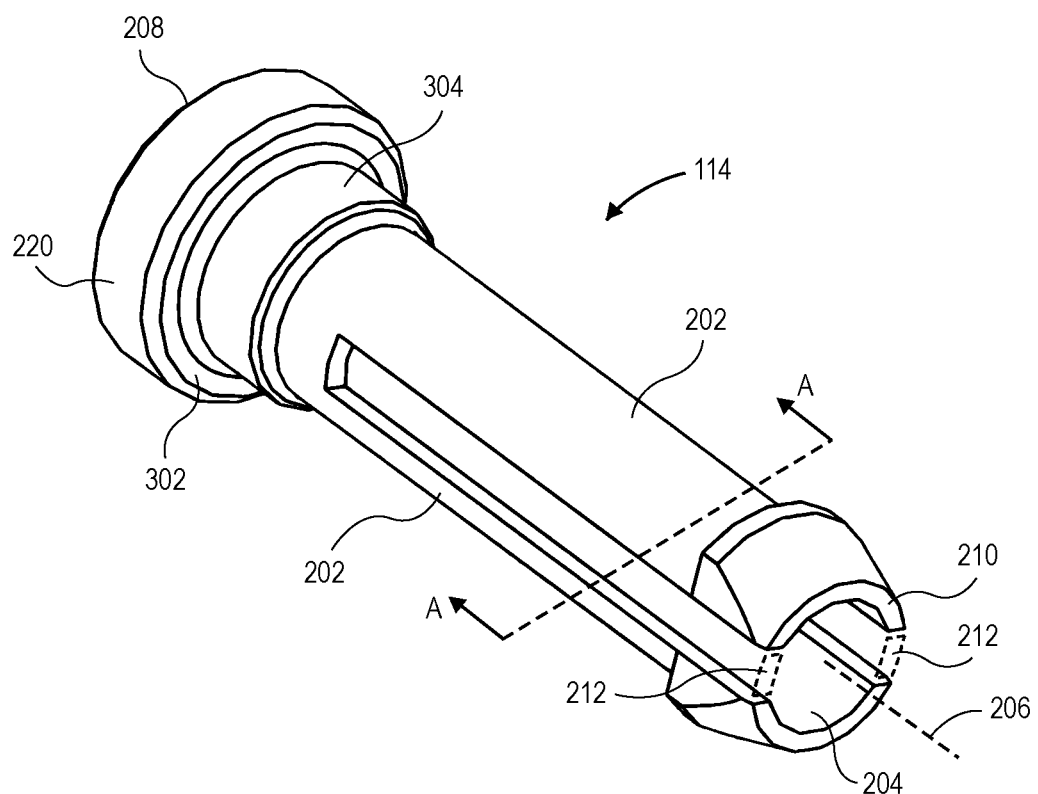
FIG. 3 is a distal perspective view of a pin body of a locking push pin, in accordance with an embodiment.

Referring to FIG. 3, a distal perspective view of a pin body of a locking push pin is shown in accordance with an embodiment. The pin body 114 can include the body head portion 220 at the proximal body end 208. The body head portion 220 may have a cylindrical outer surface that extends from the proximal body end 208 to a distal body head face 302, which faces in a distal direction. The pin body 114 may include a spring flange 304 extending distally from the distal body head face 302 along the central axis 206. The spring flange 304 may be sized to receive the compression spring 118. More particularly, an outer surface of the spring flange 304 may form a slip fit with an inner diameter of the compression spring 118. A proximal end of the compression spring 118 may therefore press against the distal body head face 302 and be stabilized by the spring flange 304 when the locking push pin 108 holds the heatsink 110 against the heat source 102.

In an embodiment, a prong portion of the locking push pin 108 having the one or more prongs 202 can extend from the spring flange 304 to the distal body end 210. The prong portion can include several prongs 202. For example, there may be two prongs 202 extending longitudinally parallel to the central axis 206, as shown. When the prong portion includes a pair of prongs 202, the prongs 202 can be separated by a first and second body slot 212. Alternatively, there may be three or more prongs 202, and each prong 202 can be separated from two other prongs by a respective pair of body slots 212. Although the pin body 114 is illustrated as having several prongs 202, it will be appreciated that the locking push pin 108 may have only one prong 202. For example, the single prong 202 may have a C-shaped cross section in which the ends of the C are separated by the body slot 212, and a portion of the C diametrically opposed to the body slot 212 can be a living hinge that allows the C-shape to flex such that the ends of the C approach each other. In any case, the one or more body slots 212 provide clearance for the one or more prongs 202 to deflect toward each other and to move radially inward to reduce an overall cross-sectional dimension of the prong portion, e.g., at the distal body end 210.

Figure 4:
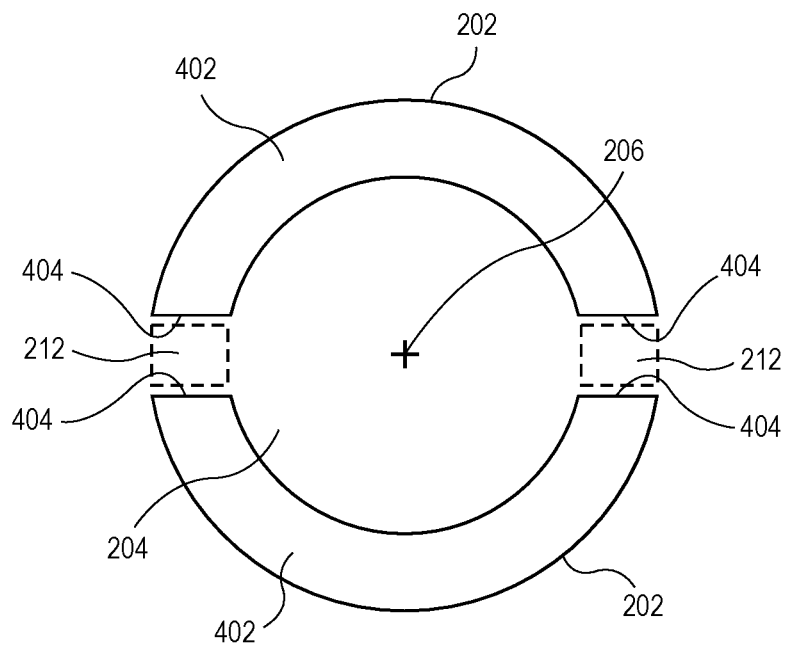
FIG. 4 is a cross-sectional view of a pin body, taken about line A-A of FIG. 3, in accordance with an embodiment.

Referring to FIG. 4, a cross-sectional view of a pin body, taken about line A-A of FIG. 3, is shown in accordance with an embodiment. The prong portion can extend around the body lumen 204, which extends entirely through the locking push pin 108 from the proximal body end 208 to the distal body end 210. More particularly, a prong wall 402 of each of the prongs 202 of the prong portion can extend laterally around a portion of the body lumen 204. The prong portion can therefore surround the body lumen 204, except for those locations at which body slots 212 extend radially outward, relative to the central axis 206, from the body lumen 204. The body slots 212 are illustrated as gaps between the prong walls 402 of the prongs 202. The body slots 212 are radially outward from the body lumen 204, albeit connected to the body lumen 204. More particularly, the body slots 212 are between peripheral surfaces 404 of the prongs 202. Each peripheral surface 404 can face another. For example, in the case of a slotted circular prong portion, each prong 202 can have an arcuate cross-section. The ends of the arc-shaped sections that face each other are the peripheral surfaces 404 within which the body slots 212 are defined. The body slots 212 may be further defined as being between an outer dimension of the body lumen 204 and an outer dimension of the prong walls 402.

Figure 5:
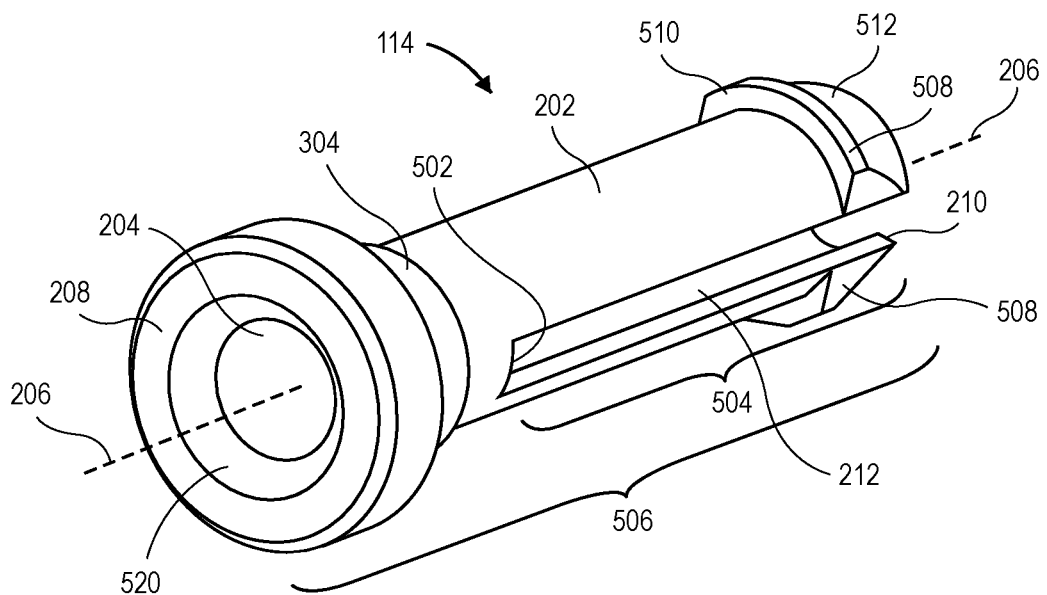
FIG. 5 is a proximal perspective view of a pin body of a locking push pin, in accordance with an embodiment.

Referring to FIG. 5, a proximal perspective view of a pin body of a locking push pin is shown in accordance with an embodiment. In addition to having the cross-sectional characteristics described above, each body slot 212 can extend from the distal body end 210 to a respective proximal slot end 502. The proximal slot end 502 may be located longitudinally between the distal body end 210 and the spring flange 304. A slot length 504 can be defined between the distal body end 210 and the proximal slot end 502. The longer the slot length 504, the more easily the prongs 202 can deflect toward each other at the distal body end 210. More particularly, the longer the slot length 504, the larger the cantilever of the prongs 202, and thus, the lower the stress that is generated at the proximal slot end 502 at the root of the body slot 212 by the action of pushing the distal body end 210 through a hole 106 of PCB 104. The action of pushing the distal body end 210 through the hole 106 can cause radially inward deflection of prongs 202 so as to enable distal end 210 to pass through the hole 106. The slot length 504, as well as the shape, dimensions, and configuration of prongs 202, can be tuned to facilitate such ease of deflection of the distal body end 210. Stress analysis techniques may be used to ensure that mechanical stress in the body material at the proximal slot end 502 will not result in significant plastic deformation the body material, e.g., mechanical yield, or breakage of the prongs 202 when the prongs deflect toward each other to collapse while passing through the hole 106 in the PCB 104. For example, the slot length 504 may be at least half of a body length 506 between the distal body end 210 and the proximal body end 208. The longer slot length 504 can improve a durability of the locking push pin 108 as compared to push pins that have, for example, short bifurcated ends that generate high stresses at the root of the bifurcation.

One or more of the prongs 202 include a retention feature 508 extending radially outward at the distal body end 210. The retention feature 508 can include a proximal retention surface 510 and a distal retention surface 512. In an embodiment, each of the retention features 508 include barbs to facilitate engagement between the distal body end 210 and a bottom surface of the carrier substrate 104. The proximal retention surface 510 of the barbs can extend along a transverse plane that is orthogonal to the central axis 206. By contrast, the distal retention surface 512 of the barbs can taper in a distal direction from an outermost edge of the retention feature 508 to the distal body end 210. Accordingly, the distal retention surface 512 of the retention feature 508 can wedge through the holes in the heatsink 110 and/or carrier substrate 104 in a distal direction, and the proximal retention surface 510 can resist back out in a proximal direction by engaging a bottom surface of the carrier substrate 104.

A pin body 114 can include other features to accommodate portions of the pin lock 116. In an embodiment, the pin body 114 has a chamfer 520 extending from the proximal body end 208 to the inner surface surrounding the body lumen 204. The chamfer 520 may accommodate a corresponding radius on the pin lock 116. As described below, the pin lock 116 may incorporate a radius on lock boss 606 to strengthen a connection between branches 214 and the lock head portion 222. Accordingly, the chamfer 520 can be an important feature in that it provides clearance for radius on lock boss 606 of the pin lock 116, and therefore facilitates a robustness of the locking push pin 108.

The pin body 114 may be formed from a variety of suitable materials. For example, the pin body 114 may be fabricated from brass. The brass may be lead-free brass. Brass may be particularly suitable for the pin body 114 because brass offers resistance to temperatures and thermal cycling encountered in many electronic applications in which locking push pin 108 may be employed, while also being easy to fabricate by machining and therefore resulting in low cost of manufacture. The pin body 114, however, may be fabricated from other materials such as other metals or plastics.

Figure 6:
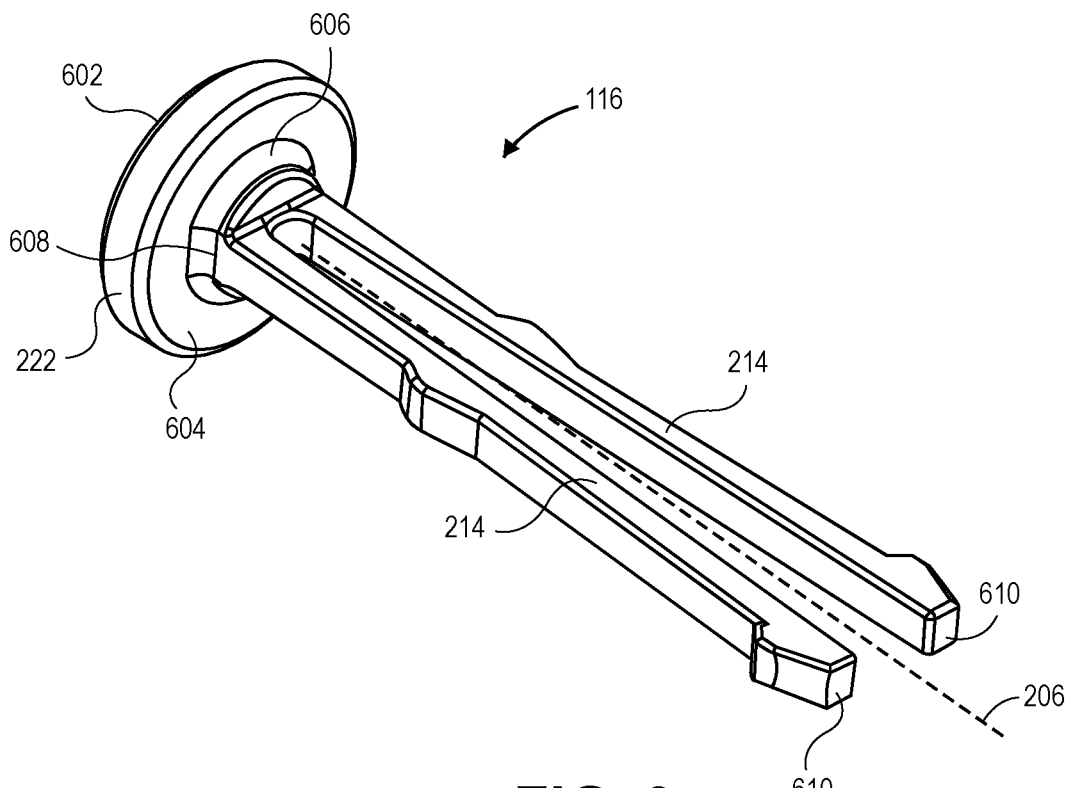
FIG. 6 is a distal perspective view of a pin lock of a locking push pin, in accordance with an embodiment.

Referring to FIG. 6, a distal perspective view of a pin lock of a locking push pin is shown in accordance with an embodiment. The pin lock 116 may have several portions formed monolithically or assembled as different pieces. For example, the pin lock 116 can be machined, cast, or molded from a single material, such as plastic.

As described above, the pin lock 116 may include a lock head portion 222 disposed at a proximal end. The lock head portion 222 can include a cylindrical outer surface extending from a proximal head end 602 to a distal lock head face 604. The distal lock head face 604 can extend along a transverse plane that is orthogonal to the central axis 206. Accordingly, the distal lock head face 604 can conform to the flat surface of the proximal body end 208 when the pin lock 116 is advanced to the locked configuration.

A lock boss 606 can extend distally from the distal lock head face 604, and may have the radius described above. The radius may conform to and fit within the chamfer 520 of the pin body 114. In an embodiment, the lock boss 606 smoothes a transition from the lock head portion 222 to the branch(es) 214. More particularly, the lock boss 606 renders a connection between the branch 214 and the lock head portion 222 more robust and durable.

In an embodiment, the pin lock 116 includes one or more branches 214 extending distally from the lock head portion 222 and/or the lock boss 606. A number of branches 214 of the pin lock 116 can correspond to a number of body slots 212 of the pin body 114. For example, whereas the pin body 114 described above can include two body slots 212, the pin lock 116 may have two corresponding branches 214. The branches 214 may have an annular orientation corresponding to the matching body slots 212. For example, when the body slots 212 of the pin body 114 are diametrically opposed, e.g., separated by 180° (FIG. 3), so may the branches 214 be separated diametrically relative to the central axis 206. As another example, in an embodiment in which the pin body 114 has a single prong 202, e.g., a prong 202 having a living hinge, and thus a single body slot 212, the pin lock 116 may have a single branch 214. Similarly, when the pin body 114 has more than two prongs 202, e.g., three prongs 202, separated by a same number of body slots 212, the pin lock 116 can have a matching number of branches 214, e.g., three. Accordingly, each branch 214 of the pin lock 116 can extend into the body lumen 204 of the pin body 114 in alignment with a corresponding body slot 212 of the pin body 114.

Each branch 214 of the pin lock 116 may extend from a proximal branch end 608, e.g., at a distal surface of the lock boss 606 to a respective distal branch end 610. A length between the proximal branch end 608 and the distal branch end 610 can define a branch length. Each branch 214 can have an aspect ratio that defines the branch 214 as being long and slender. For example, the branch length may be at least 10 times, e.g., more than 20 times, a cross-sectional dimension of the branch 214 taken orthogonal to the branch length. Such an aspect ratio allows the branch 214 to deflect easily in a radial direction with respect to the central axis 206. Accordingly, the branches 214 can move within the body lumen 204 in contact with an inner surface of the prongs 202 without applying a significant radial force to the prongs 202. Moreover, the pin body 114 can be formed from brass and the pin lock 116 can be formed from a polymer that is less stiff than the brass such that the prongs 202 cause the branches 214 to deflect radially inward rather than being forced radially outward by the branches 214.

Referring to FIG. 7, a side view of a pin lock of a locking push pin is shown in accordance with an embodiment. The branches 214 of the pin lock 116 can extend from respective proximal branch ends 608 to distal branch ends 610 along a respective branch axis 702. The branch axis 702 can be oblique to the central axis 206 such that the branch 214 extends at an angle from the central axis 206. Furthermore, a radial separation between the distal branch ends 610 may be greater than an inner dimension of the body lumen 204. The oblique angle and distal separation between the branch ends 610 means that the branches 214 must be deflected radially inward to insert into the body lumen 204. Furthermore, as the branches 214 are advanced further into the body lumen 204, a resilience of the pin lock 116 material will bias the distal branch ends 610 radially outward against an inner surface of the body lumen 204. Accordingly, when the distal branch ends 610 arrive at the body slots 212, the ends will deflect radially outward into the body slots 212 to fill at least a portion of the body slots 212. More particularly, the resilience of the branches 214 can cause the branches to fill a least a portion of the body slot 212 proximal to the retention feature 508 of the pin body 114, as the pin lock 116 advances and retracts relative to the pin body 114.

In an embodiment, the branch 214 includes a radial protrusion 704 at the distal branch end 610. The radial protrusion 704 can be shaped to interact with external components, such as the pin body 114 and the carrier substrate 104. The radial protrusion 704 can include a distal protrusion surface 706 and a proximal protrusion surface 708. One or both of the protrusion surfaces can taper to meet at a protrusion apex 710. For example, distal protrusion surface 706 can taper radially inward from the protrusion apex 710 in a distal direction. The proximal protrusion surface 708 may be contrasted with the proximal retention surface 510. For example, the proximal protrusion surface 708 may optionally taper radially inward from the protrusion apex 710 in a proximal direction. The tapering protrusion surfaces may allow the radial protrusion 704 of the branch 214 to advance and retract more easily through the substrate hole 106 in the carrier substrate 104. The proximal protrusion surface 708 may have a taper that is steep enough, however, such that when the radial protrusion 704 is pulled against the proximal slot end 502, the shape of the radial protrusion 704 engages the slot end to reduce a likelihood that the pin lock 116 will be pulled out or will fall out of the pin body 114.

In an embodiment, the proximal protrusion surface 708 can be similar to the proximal retention surface 510 of the barb. For example, proximal retention surface 708 can extend orthogonal to the central axis 206 (not shown). More particularly, the proximal protrusion surface 708 can extend along a transverse plane that is orthogonal to the central axis 206 and/or parallel to a transverse plane along which proximal retention surface 510 extends.

Optionally, the branch 214 may include a detent 712 to provide tactile feedback and locking functionality relative to the body slot 212. More particularly, the detent 712 can be located proximal to the distal branch end 610 at a location such that the detent 712 is disposed within the body slot 212 at the proximal slot end 502 when the distal branch end 610 is at the distal body end 210. More particularly, the detent 712 may be spaced apart from the distal branch end 610 by a distance that is equal (or similar) to the slot length 504. Accordingly, the detent 712 can resist pull out of the pin lock 116 from the pin body 114 when the distal branch end 610 has locked the retention feature 508 of the pin body 114 below the carrier substrate 104. Incorporation of detent 712 is not necessary to enable the operation of the present invention; detent 712 is an optional feature that may or may not be included based on the specific application.

In an embodiment, the detent 712 can include a distal detent surface 714 and a proximal detent surface 716. One or both of the detent surfaces can taper to meet at a detent apex 718. For example, the proximal detent surface 716 can taper radially inward from the detent apex 718 in a proximal direction, and the distal detent surface 714 can taper radially inward from the detent apex 718 in a distal direction. The tapering distal detent surface 714 may allow the detent 712 of the branch 214 to be inserted more easily into the body lumen 204 through the body hole in the pin body 114. Ease of insertion of detent 712 is further facilitated by the cooperative disposition of detent surface 714 and chamfer 520 that together cause branch 214 to displace in a radially-inward direction as pin lock 116 is advanced during insertion. By contrast, the proximal detent surface 716 may be steep enough such that, when the detent 712 is pulled against the proximal slot end 502, the shape of the detent 712 engages the slot to reduce a likelihood that the pin lock 116 will be pulled out or will fall out of the pin body 114.

Referring to FIG. 8, a flowchart of a method of assembling a heatsink assembly using a locking push pin is shown in accordance with an embodiment. The operations of the method illustrated in FIG. 8 correspond to various stages of assembling the heatsink assembly, as shown in FIGS. 9-13, and thus, FIGS. 8-13 are described in combination below.

At operation 802, the pin body 114 of the locking push pin 108 is inserted through the heatsink 110 and the carrier substrate 104. The heatsink 110 can be mounted on the heat source 102 carried by the carrier substrate 104. Furthermore, prior to and/or in preparation for operation 802, the compression spring 118 can be located between the body head portion 220 and the heatsink 110 to provide a downward force on the heatsink 110 when the locking push pin 108 has secured the heatsink 110 to the carrier substrate 104.

Referring to FIG. 9, in the unlocked configuration, the distal body end can be inserted through the heatsink hole and the substrate hole. The locking push pin 108 can be installed into the heatsink 110 and the carrier substrate 104 from a top side of the components. More particularly, the locking push pin 108 can be pressed downward through the components such that locking push pin 108 extends from the proximal body end 208 of the pin body 114 above the heatsink 110 (depicted leftward of the heatsink 110) to the distal body end 210 below the carrier substrate 104 (depicted rightward of the carrier substrate 104).

The pin lock 116 can be preassembled into the pin body 114 such that the distal branch end 610 is disposed within the body slot 212 between the peripheral surfaces 404 outside of the body lumen 204. Accordingly, the locking push pin 108 may have no loose parts. The distal branch end 610 can be slidable within the body slot 212 between the proximal slot end 502 and the distal body end 210. During insertion, the distal branch end 610 can be retracted to the proximal slot end 502 such that the retention features 508 at the distal body end 210 can collapse radially inward when forced through the holes of the heatsink 110 in the carrier substrate 104. Accordingly, the retention feature 508 can be pushed downward through the holes to a location below the carrier substrate 104.

At operation 804, the pin lock 116 is advanced within the pin body 114 to transition the distal branch ends 610 of the locking push pin 108 from the unlocked configuration to a locked configuration. In the unlocked configuration (FIG. 9), the distal branch ends 610 are above the carrier substrate 104. In the locked configuration (FIG. 13), the distal branch ends 610 are below the carrier substrate 104. The transition between the unlocked configuration and the locked configuration, e.g., as the distal branch end 610 slides downward within the body slot 212 from the proximal slot end 502 to the distal body end 210, is described further with respect to FIGS. 10-12.

Figure 10:
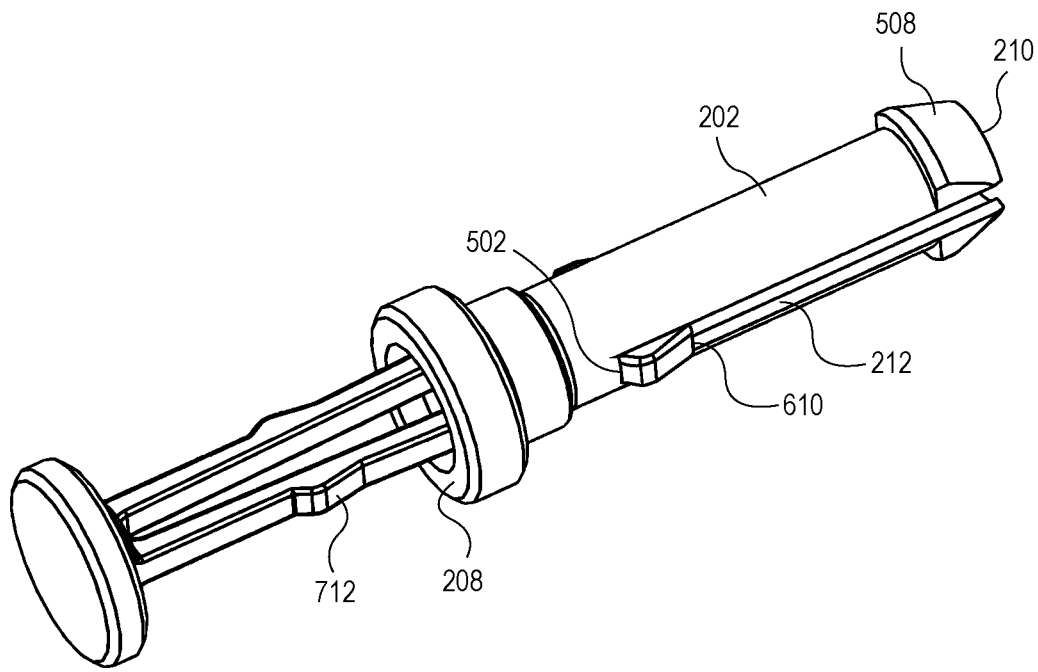

Referring to FIG. 10, the locking push pin is shown in the unlocked configuration. In the unlocked configuration, the distal branch end 610 can be located within the body slot 212 at the proximal slot end 502. In such configuration, the detent 712 of the branch 214 may be proximal to the proximal body end 208. Whereas the distal branch end 610 is between the prongs 202 proximal to the retention feature 508, the slot between the retention features 508 allows the prongs 202 to deflect radially inward at the distal body end 210.

Figure 11:
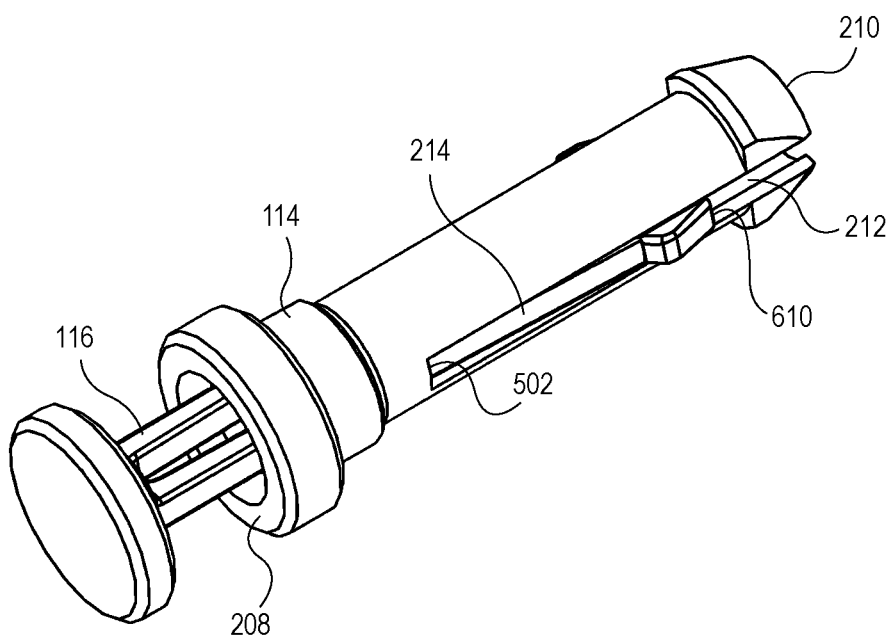

Referring to FIG. 11, body slot 212 extends from the distal body end 210 below the carrier substrate 104 to the proximal slot end 502 above the carrier substrate 104, and thus, advancing the pin lock 116 includes sliding the distal branch end 610 within the body slot 212 from the proximal slot end 502 toward the distal body end 210. As the pin lock 116 is advanced relative to pin body 114, the detent 712 can be inserted into the body lumen 204 between the proximal body end 208 and the proximal slot end 502. In this intermediate configuration, the branch 214 can fill a least a portion of the body slots 212 radially outward of the body lumen 204 and proximal to the distal body end 210 such that the branches 214 are guided forward and the cantilever length of the prongs 202 is reduced. More particularly, as the branches 214 slide forward within the body slots 212, a distance between the distal body end 210 and the distal branch end 610 reduces, and thus, the cantilever length of the prongs 202 distal to the distal branch end 610 becomes less. As the cantilever length reduces, a radial force required to deflect the retention features 508 inward becomes greater. In other words, displacement of the retention features 508 is impeded causing the retention features 508 to begin to lock within the substrate hole 106.

Figure 12:
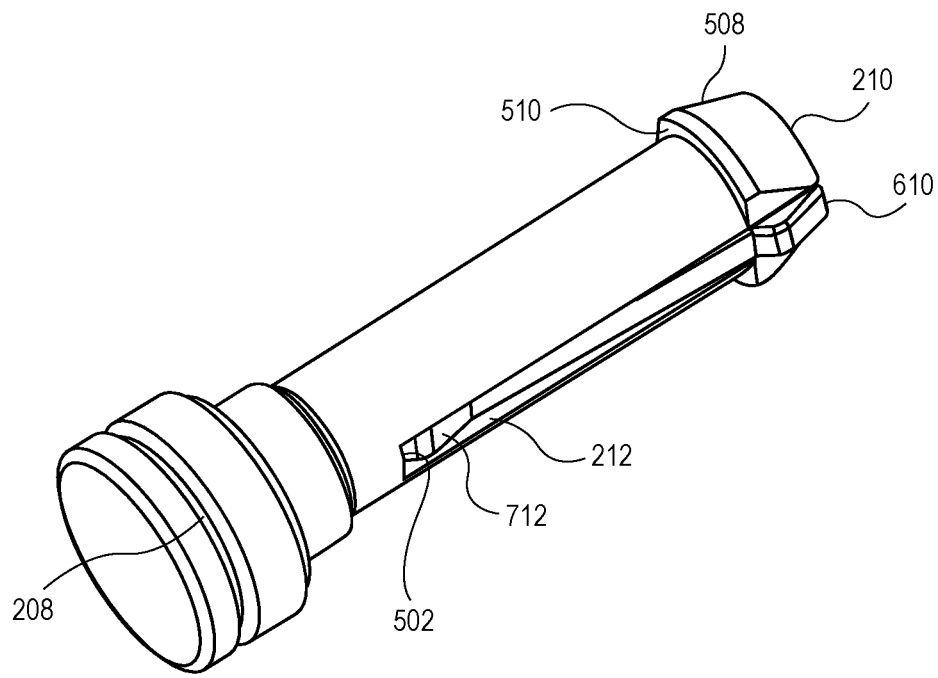

Referring to FIG. 12, the locking push pin 108 is shown in the locked configuration. In the locked configuration, the detent 712 is disposed within the body slot 212 at the proximal slot end 502. Accordingly, advancing the pin lock 116 from the unlocked configuration to the locked configuration can include advancing the detent 712 from above the proximal body end 208 in the unlocked configuration (FIG. 10) to the proximal slot end 502 within the body slot 212 in the locked configuration (FIG. 12).

Similar to the partially locked configuration (FIG. 11), in the fully locked configuration (FIG. 12), the branch 214 fills at least a portion of the body slot 212 proximal to the distal body end 210. For example, the branch 214 can fill a portion of the slot extending from the distal body end 210 to a location proximal to the retention feature 508. When the branch 214 fills the slot between the retention feature 508, the prongs 202 of the pin body 114 are locked in place. More particularly, the cantilever length of the prongs 202 is effectively zero at the distal body end 210, and thus, displacement of the retention features 508 in a radially inward direction is prevented. Rather than imposing a radially outward force on the retention features 508 to lock the retention features 508 below the carrier substrate 104, the pin lock 116 blocks inward movement of the retention features 508 to secure the retention features 508, e.g., the proximal retention surface 510 against a bottom surface of the carrier substrate 104.

In the locked configuration, the branch 214 can extend from the proximal branch end 608 (hidden within a portion of the pin body 114 proximal to the proximal slot end 502) to the distal branch end 610. More particularly, the proximal branch end 608 can be proximal to the proximal slot end 502 when the distal branch end 610 is at the distal body end 210. This geometric relationship between the branch length and the prong length is allowable because the locking push pin 108 has a functional paradigm of filling the body slot 212 to passively block movement of the retention feature 508 as compared to actively biasing the retention feature 508 in a particular direction. The paradigm has several advantages. Because the branch 214 need only fill the body slot 212 rather than push outward on the prongs 202, the branches 214 can be long, slender, and flexible. For example, the proximal branch end 608 can be proximal to the proximal slot end 502, and even though the branch 214 is longer than and more flexible than the prongs 202, it can still lock the prongs 202 within the carrier substrate 104 without having to force the prongs 202 radially outward. Given that the gap between the branches 214 can extend proximal to the detents 712, and the branches 214 can be highly flexible, low stress is generated at the proximal branch ends 608, and thus, the durability of the locking push pin 108 can be increased.

Figure 13:
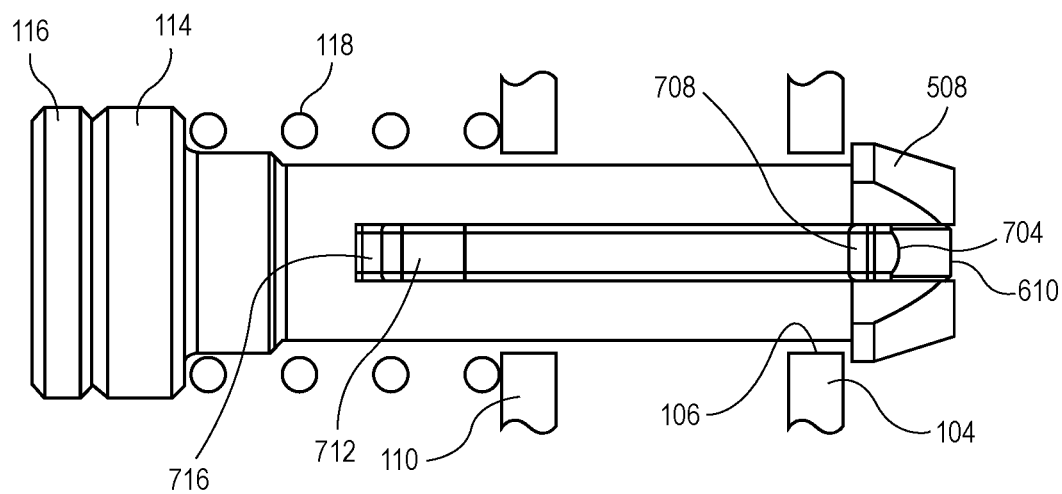

Referring to FIG. 13, the locking push pin 108 is shown in the locked configuration and securing the heatsink 110 to the carrier substrate 104. When the branch 214 has filled the body slot 212 between the retention features 508 and proximal to the retention features 508, the locking push pin 108 is secured within the carrier substrate 104. More particularly, in such configuration the retention features 508 cannot collapse or deflect radially inward, and thus, cannot be pulled out of the substrate hole 106.

The detent 712 can hold the pin lock 116 in place relative to the pin body 114. More particularly, similar to the manner in which the radial protrusion 704 holds the pin lock 116 in position within the pin body 114 to avoid loose parts during the unlocked configuration, the detent 712 can hold the pin lock 116 in place during the locked configuration by resisting axial loading generated by shock and vibration.

Although the detents 712 and the radial protrusions 704 can secure the locking push pin 108 in the locked configuration, the lock state may be reversible. For example, the proximal detent surface 716 can be sloped at an angle that allows the pin lock 116 to be retracted relative to the pin body 114 when appropriate force is applied. The retraction force may be greater than a shock or vibration load that is expected to be seen during operation. The retraction force may, however, be within ergonomic limits to allow a user to pull the pin lock 116 to transition the locking push pin 108 from the locked configuration to the unlocked configuration. This reversal can be facilitated both by the sloped proximal detent surface 716 and a sloped proximal protrusion surface 708. More particularly, the sloped surface of the radial protrusion 704 can allow the distal barbed end to deflect inward and pull through the carrier substrate 104 rather than catching on the carrier substrate 104, as may be the case with the proximal retention surface 510. Accordingly, the locking push pin 108 can be removed by a user from above, rather than requiring that the user push the fastener out of the substrate hole 106 from below. This can make the locking push pin 108 easier to use than existing push pins.

In the locked configuration, the compression spring 118 can be pressed between the pin body 114 and the heatsink 110. The retention feature 508 can retain the pin body 114 within the carrier substrate 104, and thus, the compression spring 118 can press the heatsink 110 downward relative to the carrier substrate 104. Given that the locking push pin 108 can achieve good retention within the carrier substrate 104, a stronger compression spring 118 may be used to push the heatsink 110 against the heat source 102 without risking back out of the locking push pin 108 from the carrier substrate 104. This additional downward pressure can cause the heatsink 110 to securely contact the heat source 102, and thus, may improve heat transfer from the heat source 102 to the heatsink 110.

Figure 14:
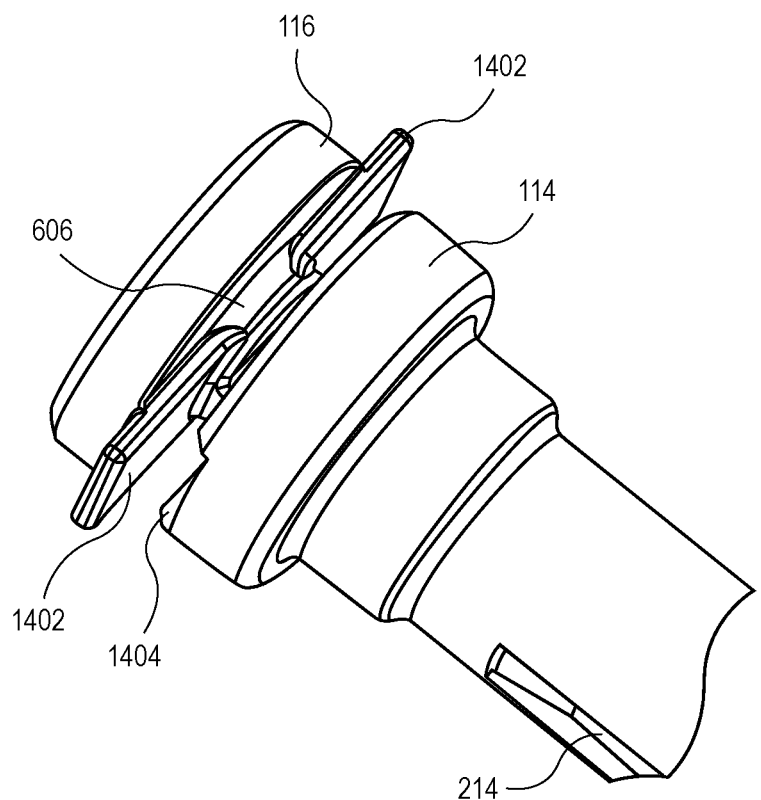
FIG. 14 is a distal perspective view of a locking push pin having alignment tabs, in accordance with an embodiment.

Referring to FIG. 14, a distal perspective view of a locking push pin having alignment tabs is shown in accordance with an embodiment. The locking push pin 108 can include an optional alignment/extraction feature. In an embodiment, one or more tabs extend radially outward from a portion of the pin lock 116. For example, a tab 1402 can extend radially outward from the lock boss 606 of the pin lock 116. The tab 1402 can be sized and configured to insert within a corresponding groove 1404 in the pin body 114. More particularly, the pin body 114 can include a groove 1404 in the body head portion 220 to receive the tab 1402.

Figure 15:
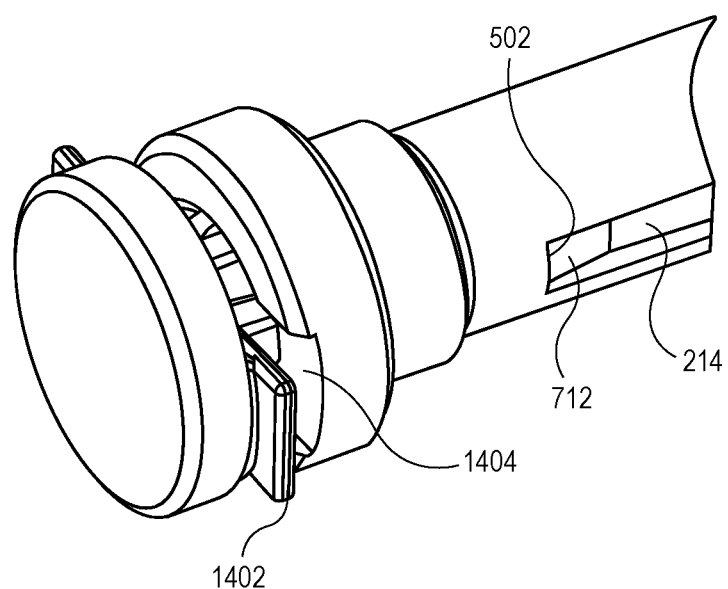
FIG. 15 is a proximal perspective view of a locking push pin having alignment tabs, in accordance with an embodiment.

Referring to FIG. 15, a proximal perspective view of a locking push pin having alignment tabs is shown in accordance with an embodiment. The tabs 1402 of the pin lock 116 can be configured to align with and fit within the grooves 1404. For example, a width of the tabs 1402 may be slightly smaller than a width of the grooves 1404 to allow the tabs 1402 to advance into the grooves 1404. A relative orientation and location between the tabs 1402 and the branch 214 can allow the tabs 1402 to be used to confirm both that the branch 214 is aligned to the body slot 212 and that the locking push pin 108 is in the locked configuration. First, the relative angular orientation can be selected such that when the tab 1402 is aligned with the groove 1404, the branch 214 is aligned with the body slot 212. For example, the tab 1402, the groove 1404, the branch 214, and the body slot 212 may all be aligned along a same longitudinal plane. Accordingly, the user can observe that the tab 1402 is aligned with the groove 1404 to confirm that the branch 214 is aligned with and inserted within the body slot 212. Second, a distance between the tab 1402 and the detent 712 may be equal (or similar) to a distance between the groove 1404 and the proximal slot end 502 such that when the tab 1402 is inserted into the groove 1404, the detent 712 is at the proximal slot end 502. Accordingly, a user can observe that the tab 1402 is inserted within the groove 1404 to confirm that the detent 712 is within the body slot 212, and thus, the locking push pin 108 is in the locked configuration.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A locking push pin, comprising:
  a pin body including a body lumen extending along a central axis in a distal direction from a body head portion at a proximal body end to a retention feature at a distal body end, one or more prongs radially outward from the body lumen and extending longitudinally to the distal body end, and a body slot extending radially outward from the body lumen between peripheral surfaces of the one or more prongs; and
  a pin lock in the body lumen, the pin lock including a branch extending along a branch axis obliquely outward in the distal direction relative to the central axis of the body lumen from a locking head portion to a distal branch end, wherein the distal branch end is disposed within the body slot between the peripheral surfaces outside of the body lumen at the distal body end when the locking push pin is in a locked configuration.

2. The locking push pin of claim 1, wherein the body slot extends from the distal body end to a proximal slot end, and wherein the distal branch end is slidable within the body slot between the proximal slot end and the distal body end.

3. The locking push pin of claim 2, wherein the branch extends from a proximal branch end to the distal branch end, and wherein the proximal branch end is in a proximal direction from the proximal slot end when the distal branch end is at the distal body end.

4. The locking push pin of claim 2, wherein the one or more prongs includes a pair of prongs, wherein a slot length of the body slot from the distal body end to the proximal slot end is such that material of the pin body at the proximal slot end does not mechanically yield when the pair of prongs deflect toward each other.

5. The locking push pin of claim 2, wherein the branch includes a detent in a proximal direction from the distal branch end, and wherein the detent is disposed within the body slot at the proximal slot end when the distal branch end is at the distal body end.

6. The locking push pin of claim 5, wherein the detent has a proximal detent surface tapering radially inward in the proximal direction.

7. The locking push pin of claim 1, wherein the branch includes a radial protrusion at the distal branch end.

8. The locking push pin of claim 7, wherein the radial protrusion has a proximal protrusion surface tapering radially inward in a proximal direction.

9. The locking push pin of claim 1, wherein the retention feature extends radially outward at the distal body end, and wherein the branch fills at least a portion of the body slot in a proximal direction from the retention feature when the distal branch end is at the distal body end.

10. The locking push pin of claim 9, wherein the retention feature includes a barb.

11. A heatsink assembly, comprising:
  a heat source mounted on a carrier substrate having a substrate hole;
  a heatsink mounted on the heat source and having a heatsink hole; and
  a locking push pin including
    a pin body extending through the substrate hole and the heatsink hole from a proximal body end to a distal body end, wherein the pin body includes a body lumen extending along a central axis in a distal direction from a body head portion at the proximal body end to a retention feature at the distal body end, one or more prongs radially outward from the body lumen and extending longitudinally to the distal body end, and a body slot extending radially outward from the body lumen between peripheral surfaces of the one or more prongs, and a pin lock in the pin body, the pin lock including a branch extending along a branch axis obliquely outward in a distal direction relative to the central axis of the body lumen from a locking head portion to a distal branch end, wherein the distal branch end is disposed within the body slot between the peripheral surfaces outside of the body lumen at the distal body end when the locking push pin is in a locked configuration.

12. The heatsink assembly of claim 11, wherein the body slot extends from the distal body end below the carrier substrate to a proximal slot end above the carrier substrate, and wherein the distal branch end is slidable within the body slot from the proximal slot end in an unlocked configuration to the distal body end in a locked configuration.

13. The heatsink assembly of claim 12, wherein the branch extends from a proximal branch end to the distal branch end, and wherein the proximal branch end is in a proximal direction from the proximal slot end in the locked configuration.

14. The heatsink assembly of claim 12, wherein the branch includes a detent in a proximal direction from the distal branch end, and wherein the detent is disposed within the body slot at the proximal slot end in the locked configuration.

15. The heatsink assembly of claim 11, wherein the retention feature extends radially outward at the distal body end, and wherein the branch fills at least a portion of the body slot in a proximal direction from the retention feature to lock the one or more prongs below the carrier substrate when the distal branch end is at the distal body end.

16. A method, comprising:

inserting a pin body of a locking push pin through a heatsink and a carrier substrate, wherein the heatsink is mounted on a heat source carried by the carrier substrate, and wherein the locking push pin extends from a proximal body end of the pin body above the heatsink to a distal body end of the pin body below the carrier substrate;

advancing a pin lock of the locking push pin within a body lumen of the pin body, wherein the body lumen extends along a central axis in a distal direction from a body head portion at the proximal body end to a retention feature at the distal body end, one or more prongs radially outward from the body lumen extend longitudinally to the distal body end, and a body slot extends radially outward from the body lumen between peripheral surfaces of the one or more prongs, wherein the pin lock includes a branch extending along a branch axis obliquely outward in a distal direction relative to the central axis of the body lumen, wherein the branch extends in the body lumen to a distal branch end disposed within the body slot between the peripheral surfaces outside of the body lumen at the distal body end when the locking push pin is in a locked configuration, and wherein the distal branch end advances from above the carrier substrate when the locking push pin is in an unlocked configuration to below the carrier substrate when the locking push pin is in the locked configuration.

17. The method of claim 16, wherein the body slot extends from the distal body end below the carrier substrate to a proximal slot end above the carrier substrate, and wherein advancing the pin lock includes sliding the distal branch end within the body slot from the proximal slot end in the unlocked configuration to the distal body end in the locked configuration.

18. The method of claim 17, wherein advancing the pin lock includes advancing a detent of the branch from above the proximal body end in the unlocked configuration to the proximal slot end within the body slot in the locked configuration.

* * * * *